United States Patent
Nonen et al.

(10) Patent No.: US 9,041,414 B2
(45) Date of Patent: May 26, 2015

(54) DIFFERENTIAL SIGNAL TRANSMISSION CABLE PROPERTY EVALUATING MECHANISM AND EVALUATING METHOD THEREFOR

(75) Inventors: Hideki Nonen, Hitachi (JP); Takahiro Sugiyama, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 547 days.

(21) Appl. No.: 13/421,735

(22) Filed: Mar. 15, 2012

(65) Prior Publication Data

US 2013/0069670 A1    Mar. 21, 2013

(30) Foreign Application Priority Data

Sep. 16, 2011    (JP) .................................. 2011-203522

(51) Int. Cl.

| | |
|---|---|
| *G01R 29/26* | (2006.01) |
| *G01R 1/04* | (2006.01) |
| *G01R 27/04* | (2006.01) |
| *G01R 31/02* | (2006.01) |
| *H01R 12/59* | (2011.01) |

(52) U.S. Cl.
CPC .............. *G01R 1/0408* (2013.01); *G01R 27/04* (2013.01); *G01R 31/021* (2013.01); *H01R 12/598* (2013.01)

(58) Field of Classification Search
CPC ............ H01R 12/00; H01R 4/28; H01R 4/30; H01R 4/38; H01R 4/5066; H01R 9/0714; H01R 9/0521; H01R 9/2466
See application file for complete search history.

(56) References Cited

U.S. PATENT DOCUMENTS

| | | | | |
|---|---|---|---|---|
| 4,770,645 | A | * | 9/1988 | Antes ............................. 439/329 |
| 4,772,233 | A | * | 9/1988 | Hoffman ....................... 439/833 |
| 4,886,858 | A | * | 12/1989 | Katagiri et al. ............... 525/301 |
| 5,795,162 | A | * | 8/1998 | Lambert ......................... 439/63 |
| 6,602,092 | B2 | * | 8/2003 | Soubh ........................... 439/493 |
| 7,628,647 | B2 | | 12/2009 | Semba et al. |
| 2008/0139046 | A1 | | 6/2008 | Semba et al. |
| 2009/0104813 | A1 | * | 4/2009 | Chen et al. .................... 439/581 |
| 2012/0124820 | A1 | * | 5/2012 | Low ................................ 29/593 |

FOREIGN PATENT DOCUMENTS

JP    2008-108475 A    5/2008

* cited by examiner

*Primary Examiner* — Melissa Koval
*Assistant Examiner* — Daniel Miller
(74) *Attorney, Agent, or Firm* — McGinn IP Law Group, PLLC

(57) ABSTRACT

A differential signal transmission cable property evaluating mechanism includes a substrate having a signal line pad to be connected with a signal line conductor of a differential signal transmission cable and a ground pad to be connected with a shield conductor of the differential signal transmission cable, a pressing member for pressing the signal line conductor to the signal line pad, a shield conductor holding sheet including an elastic insulating sheet and a metal foil provided over one side of the elastic insulating sheet, the shield conductor holding sheet provided for indirectly connecting the shield conductor and the ground pad to each other by contacting the metal foil with the shield conductor and the ground pad, and a clip for fixing the shield conductor holding sheet.

20 Claims, 6 Drawing Sheets

DIFFERENTIAL SIGNAL TRANSMISSION CABLE PROPERTY EVALUATING MECHANISM AND EVALUATING METHOD THEREFOR

The present application is based on Japanese patent application No. 2011-203522 filed on Sep. 16, 2011, the entire contents of which are incorporated herein by reference.

BACKGROUND OF THE INVENTION

1. Field of the Invention

This invention relates to a differential signal transmission cable property evaluating mechanism and a differential signal transmission cable property evaluating method.

2. Description of the Related Art

In several Gbit/s or more high speed digital signal processing devices such as servers, routers, storage products and the like, differential signaling is used for signal transmission between the devices, or between substrates (circuit boards) in the devices.

The differential signaling refers to transmitting 180 degrees-phase inverted signals in two paired signal line conductors respectively, and combining and outputting the differential signals received in a receiver. Electrical currents flowing in the one pair of the signal line conductors respectively flow in opposite directions to each other, and electromagnetic waves radiated from the transmission lines are therefore small. Also, extrinsic noise is superimposed equally on the one pair of the signal line conductors, and the effect of the noise is therefore canceled out by the receiver combining and outputting the differential signals. For these reasons, the differential signaling is often used for high speed digital signal transmission.

As a differential signal transmission cable used for the differential signaling, there has been one having one pair of signal line conductors, an insulator for covering respective circumferences of the one pair of the signal line conductors together, a shield conductor provided around a perimeter of the insulator, and a sheath provided around a perimeter of the shield conductor.

As a mechanism for evaluating a property of the differential signal transmission cable, there has been known a type which mounts two electrical length (phase) matched semi-rigid cables to the differential signal transmission cable, but no mechanism or method for evaluating the property of the differential signal transmission cable has firmly been established.

Refer to JP-A-2008-108475, for example.

SUMMARY OF THE INVENTION

In particular, for the differential signal transmission cable, its property has tended to be discussed by mounting a rated connector to the differential signal transmission cable, but the property of the differential signal transmission cable per se without being mounted with a connector has not been well rated by standards and the like. Incidentally, in this case, a terminal of the differential signal transmission cable has been solder connected to an inner portion of the connector.

A reason for not establishing the mechanism or method for evaluating the property of the differential signal transmission cable per se has been as follows: It has been because the insulator of the differential signal transmission cable has deformed due to being heated by solder connection, or the signal line conductors have bent due to stress applied by solder connection, and an impedance mismatch has occurred at the terminal of the differential signal transmission cable, and has caused signal reflection, and further the property of the differential signal transmission cable per se has been distorted due to the effect of the reflection phenomenon thereon, i.e. the pure property of the differential signal transmission cable per se has not been shown on a measuring instrument.

Thus, in order to evaluate the pure property of the differential signal transmission cable per se, it is necessary to realize the differential signal transmission cable property evaluating mechanism capable of making the impedance mismatch caused at the terminal of the differential signal transmission cable as small as possible.

Accordingly, it is an object of the present invention to provide a differential signal transmission cable property evaluating mechanism and a differential signal transmission cable property evaluating method, which are capable of reducing an impedance mismatch caused at a terminal of a differential signal transmission cable as much as possible, and thereby evaluating a pure property of the differential signal transmission cable per se.

According to a feature of the invention, a differential signal transmission cable property evaluating mechanism comprises:

a substrate comprising a signal line pad to be connected with a signal line conductor of a differential signal transmission cable and a ground pad to be connected with a shield conductor of the differential signal transmission cable;

a pressing member for pressing the signal line conductor to the signal line pad;

a shield conductor holding sheet comprising an elastic insulating sheet and a metal foil provided over one side of the elastic insulating sheet, the shield conductor holding sheet provided for indirectly connecting the shield conductor and the ground pad to each other by contacting the metal foil with the shield conductor and the ground pad; and a clip for fixing the shield conductor holding sheet.

The differential signal transmission cable property evaluating mechanism may further comprise:

a notch provided at an edge of the substrate for accommodating a terminal of the differential signal transmission cable, wherein the signal line pad is provided at a position collinear with the signal line conductor when the terminal of the differential signal transmission cable is accommodated in the notch, wherein the ground pad comprises plural pads and provided on both sides of the notch on both surfaces of the substrate, wherein the shield conductor holding sheet comprises one pair sandwiching the shield conductor therebetween on the both surfaces of the substrate, the one pair of the shield conductor holding sheets connect the shield conductor to each of the ground pads provided on the both surfaces of the substrate.

The substrate may comprise a material having a relative permittivity of 3.8 or less at a frequency of 1 MHz.

The differential signal transmission cable property evaluating mechanism may further comprise:

a connector mounted to the substrate for connecting the substrate to a measuring instrument.

The differential signal transmission cable property evaluating mechanism may further comprise:

an electrically conductive paste provided on a surface of the ground pad.

The pressing member may comprise a transparent material having a relative permittivity not more than 3.2 at a frequency of 1 MHz.

The pressing member may comprise a material having a dielectric loss tangent not more than 0.01 at a frequency of 1 MHz.

The elastic insulating sheet may comprise a silicon sheet and the elastic insulating sheet and the metal foil are bonded together by a silicon based adhesive.

According to another feature of the invention, a differential signal transmission cable property evaluating method comprises:

evaluating a property of a differential signal transmission cable using the differential signal transmission cable property evaluating mechanism.

The differential signal transmission cable property evaluating method may comprise:

evaluating the property of the differential signal transmission cable designed to have a common mode time domain reflectometry impedance of 40Ω to 50Ω.

(Points of the Invention)

According to one embodiment of the invention, the pressing member is used to connect the signal line conductor and the signal line pad. Therefore, it is possible to reduce the impedance mismatch caused at the terminal of the differential signal transmission cable as much as possible, and thereby evaluate the pure property of the differential signal transmission cable per se. Further, the shield conductor holding sheet comprises the elastic insulating sheet and the metal foil provided over one side of the elastic insulating sheet, and can therefore be disposed along the perimeter of the shield conductor when the metal foil is contacted with the shield conductor and the ground pad to connect the shield conductor and the ground pad to each other. The shield conductor holding sheet is therefore even less likely to cause disturbance to electric field distribution around the signal line conductor, and can reduce the impedance mismatch.

According to another embodiment of the invention, it is possible to evaluate the pure property of the differential signal transmission cable per se.

BRIEF DESCRIPTION OF THE DRAWINGS

The preferred embodiments according to the invention will be explained below referring to the drawings, wherein.

DETAILED DESCRIPTION OF THE PREFERRED EMBODIMENT

Figure 1:
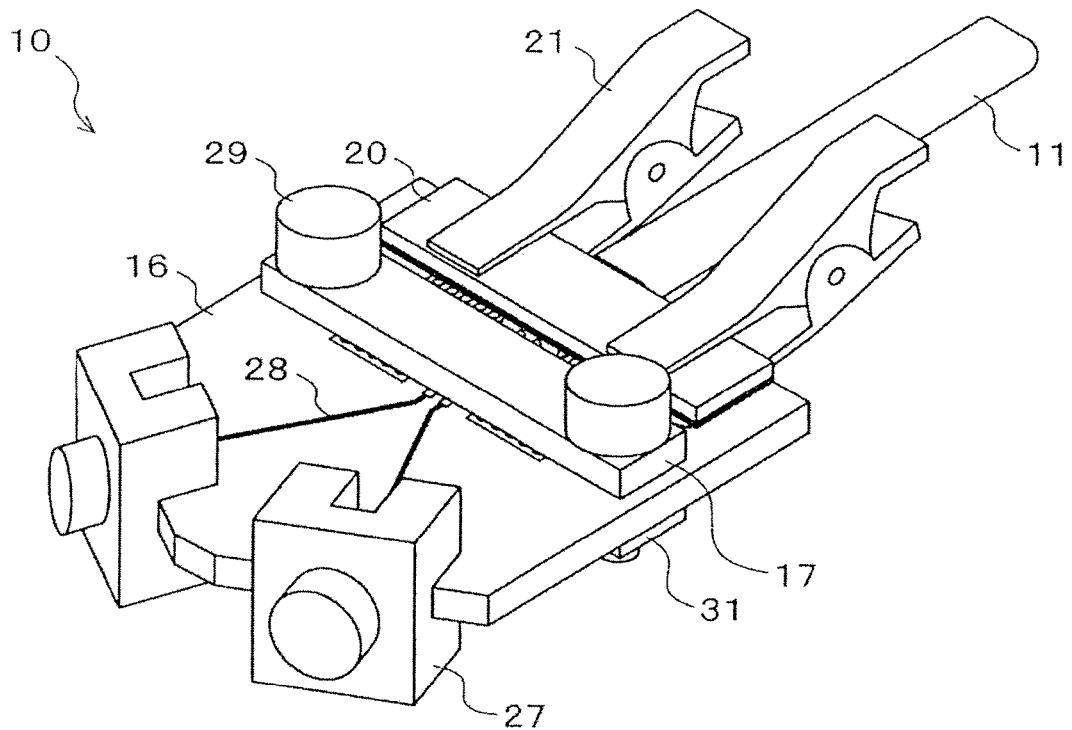
FIG. 1 is a perspective view showing a differential signal transmission cable property evaluating mechanism in an embodiment according to the invention.

Next, a preferred embodiment according to the invention will be explained below, in conjunction with the accompanying drawings.

(Structure of a Differential Signal Transmission Cable Property Evaluating Mechanism 10)

FIGS. 1 to 4 show a differential signal transmission cable property evaluating mechanism (herein simply referred to as "property evaluating mechanism") 10 in this embodiment. This property evaluating mechanism 10 is characterized by comprising a substrate 16 including a signal line pad 13 to be connected with a signal line conductor 12 of a differential signal transmission cable 11, and a ground pad 15 to be connected with a shield conductor 14 of the differential signal transmission cable 11, a pressing member 17 for pressing the signal line conductor 12 to the signal line pad 13, a shield conductor holding sheet 20 comprising an elastic insulating sheet 18, and a metal foil 19 provided over one side of the elastic insulating sheet 18, the metal foil 19 being contacted with the shield conductor 14 and the ground pad 15 to indirectly connect the shield conductor 14 and the ground pad 15 to each other; and a clip 21 for fixing the shield conductor holding sheet 20.

Figure 7:
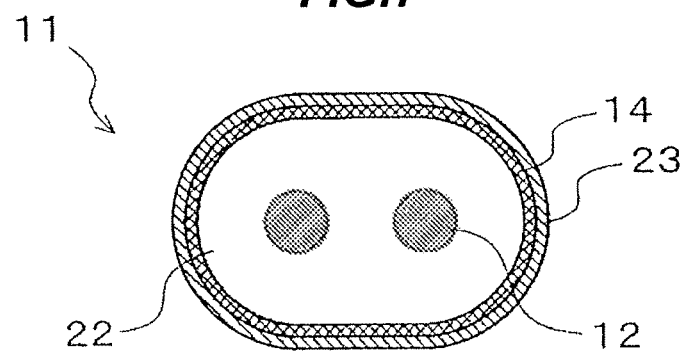
FIG. 7 is a cross sectional view showing a differential signal transmission cable used particularly in the invention.

Referring to FIG. 7, the differential signal transmission cable 11 includes one pair of the signal line conductors 12; an insulator 22 for covering respective circumferences of the one pair of the signal line conductors 12 together; the shield conductor 14 provided around a perimeter of the insulator 22; and a sheath 23 provided around a perimeter of the shield conductor 14.

(Substrate 16)

Referring again to FIG. 2, an edge of the substrate 16 is formed with a notch 24 in which a terminal of the differential signal transmission cable 11 is placed, namely, the notch 24 is configured to accommodate the terminal of the differential signal transmission cable 11. Here, the "terminal of the differential signal transmission cable 11" refers to a terminated portion thereof in which the signal line conductors 12 and the shield conductor 14 are exposed. The notch 24 has a width on the order equal to a width of the shield conductor 14 at the terminal of the differential signal transmission cable 11, and a length (depth) on the order equal to a length of the shield conductor 14 at the terminal of the differential signal transmission cable 11, and is formed in such a rectangular shape as to be open at a substrate 16 edge side end. The substrate 16 thus structured allows the shield conductor 14 at the terminal of the differential signal transmission cable 11 to be received within the notch 24, when placed therein. This can ensure that the shield conductor 14 is placed symmetrically on both surfaces of the substrate 16. The impedance mismatch is therefore reduced.

Incidentally, the substrate 16 is formed of a material whose relative permittivity is not more than 3.8 at a frequency of 1 MHz. The use of such a low relative permittivity material allows the evaluation of the differential signal transmission cable 11 for high speed transmission (e.g. 25.78125 (3 bit/s).

As the material of the substrate 16, there can be used, for example, a glass epoxy based material among others whose relative permittivity is not more than 3.8 at a frequency of 1 MHz.

Also, the thickness of the substrate 16 is set to be thinner than the thickness in transverse cross section of the shield conductor 14, so that the shield conductor 14 at the terminal of the differential signal transmission cable 11 projects from both the surfaces of the substrate 16, when placed in the notch 24. This can securely ensure the contact between the shield conductor 14 and the shield conductor holding sheet 20, when the shield conductor 14 and the ground pad 15 are connected to each other by the use of the shield conductor holding sheet 20.

(Signal Line Pad 13)

The signal line pad 13 is formed at such a position as to be collinear with the signal line conductors 12, when the terminal of the differential signal transmission cable 11 is placed in the notch 24. This allows connecting the signal line conductors 12 to the signal line pad 13 but not bending the signal line conductors 12.

(Ground Pad 15)

Two of the ground pads 15 are formed on one surface of the substrate 16 and on both sides, respectively, of the notch 24, and two of the ground pads 15 are formed on the other surface of the substrate 16 and on both the sides, respectively, of the notch 24. These four ground pads 15 are connected to an inner ground layer (not shown) of the substrate 16 by through holes (vias) 25.

(Shield Conductor Holding Sheet 20)

One pair of the shield conductor holding sheets 20 sandwich the shield conductor 14 therebetween on both the surfaces of the substrate 16, so that the one pair of the shield conductor holding sheets 20 connect the shield conductor 14 to each of the ground pads 15 formed on both the surfaces of the substrate 16.

This allows the perimeter of the shield conductor 14 to be substantially uniformly surrounded by the one pair of the shield conductor holding sheets 20. Therefore, the disturbance of electric field distribution is not likely to occur, and the impedance mismatch due to the disturbance of electric field distribution is not likely to occur.

Figure 5:
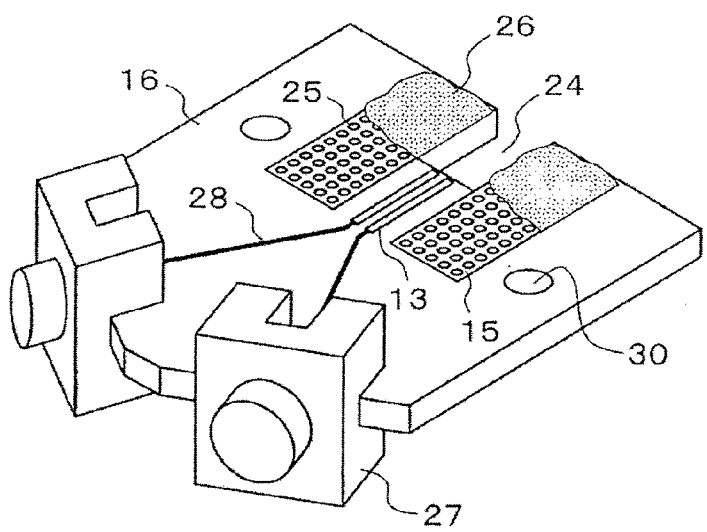
FIG. 5 is a perspective view showing a construction for ensuring the contact between a shield conductor and a ground pad.

Incidentally, it is preferred that the surface of the ground pads 15 is provided with an electrically conductive paste 26 as shown in FIG. 5. This can securely ensure the contact between the shield conductor holding sheets 20 and the ground pads 15.

Also, the substrate 16 is mounted with connectors 27 for connecting cables, respectively, of a measuring instrument to the substrate 16. Many of the cables of the measuring instrument have a large diameter, and are difficult to connect directly to the substrate 16. Therefore, such connectors 27 are used. Herein, the end launch connectors 27 are shown as one example, but the type of the connectors 27 is not limited thereto.

The connectors 27 are connected to the signal line pad 13 via traces 28, respectively, formed on the substrate 16. Therefore, the connections of the cables of the measuring instrument to the connectors 27 result in the indirect connections, respectively, between the cables of the measuring instrument and the signal line pad 13. Incidentally, the traces 28 are formed by a known technique such as microstrip wiring, coplanar wiring, or the like.

Edges of the substrate 16 mounted with these connectors 27, respectively, are being sloped in symmetrical directions with respect to an extended axis X of the differential signal transmission cable 11. The connectors 27 are mounted to the substrate 16 at the slope angles of the edges, respectively, of the substrate 16, so that when the two cables of the measuring instrument are connected to the connectors 27 respectively, the cables of the measuring instrument do not interfere with each other.

Further, the substrate 16 is formed with two through holes 30, and two fastening members (e.g. thumbscrews) 29 for fixing the pressing member 17 are inserted into the two through holes 30 respectively. The substrate 16 is provided with a fixing member 31 under the through holes 30, and the fastening members 29 inserted into the through holes 30 respectively are tightened and fixed to the fixing member 31. The fixing member 31 and the pressing member 17 sandwich the substrate 16 and the signal line conductors 12 therebetween, so that the signal line conductors 12 are pressed and connected to the signal line pad 13.

(Pressing Member 17)

The pressing member 17 is formed of a transparent material whose relative permittivity is low (e.g. not more than 3.2 at a frequency of 1 MHz). As the low relative permittivity material of the pressing member 17, there are, for example, polyetherimide (whose relative permittivity at a frequency of 1 MHz is 3.15), polycarbonate (whose relative permittivity at a frequency of 1 MHz is 2.9), etc. This has the advantages of being able to suppress the effect of the pressing member 17 on the electric field distribution around the signal line conductors 12, and being able to visually confirm the positions of the signal line conductors 12 and thereby facilitate the alignment thereof. Incidentally, the pressing member 17 is also formed of a material having a low dielectric loss tangent (e.g. not more than 0.01 at a frequency of 1 MHz). The dielectric loss tangents of the polyetherimide material and the polycarbonate material are 0.0013 and 0.009 at a frequency of 1 MHz, respectively. This allows more greatly reducing the effect of the pressing member 17 on the electric field distribution around the signal line conductors 12.

This pressing member 17 serves to reduce the impedance mismatch at the terminal of the differential signal transmission cable 11. Stripping the terminal of the differential signal transmission cable 11 to expose the signal line conductors 12 causes a significant impedance variation in the exposed signal line conductors 12 portion. When, at this point, the signal line conductors 12 are pressed by the pressing member 17, the pressing member 17 acts as an insulator covering the signal line conductors 12, therefore allowing the reduction of the impedance mismatch. Also, no solder connection is used, and therefore no impedance mismatch due to deformation of the insulator 22 caused by the solder connection occurs. Therefore, the use of the pressing member 17 in the connection between the signal line conductors 12 and the signal line pad 13 allows the reduction of the impedance mismatch.

(Elastic Insulating Sheet 18 and Metal Foil 19)

Figure 6:
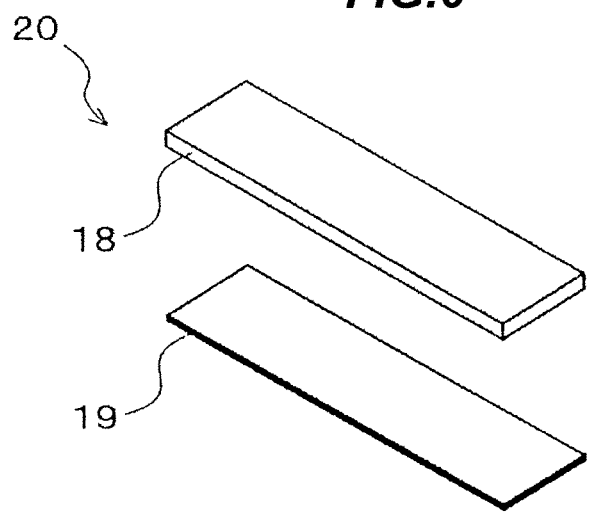
FIG. 6 is an exploded perspective view showing a specific structure of a shield conductor holding sheet.

Referring to FIG. 6, there is shown the shield conductor holding sheet 20 provided with the metal foil 19 over one side of the elastic insulating sheet 18. This elastic insulating sheet 18 is formed of a silicon sheet, and the elastic insulating sheet 18 and the metal foil 19 are bonded together by a silicon based adhesive.

The silicon sheet 18 has an excellent elastic force, and therefore allows the shield conductor holding sheet 20 to be disposed along the perimeter of the shield conductor 14 when connecting the shield conductor 14 and the ground pads 15. The shield conductor holding sheet 20 is therefore even less likely to cause the disturbance of the electric field distribution, and can reduce the impedance mismatch.

Also, the silicon sheet 18 has an excellent restoring force, and therefore allows the evaluation of the differential signal transmission cable 11 in substantially the same conditions, i.e. with a high reproducibility even when the same shield conductor holding sheet 20 is repeatedly used. The shield conductor holding sheet 20 is therefore excellent in the reliability of the property evaluation, and is economical.

For the same reason as above, the silicon based adhesive is used for bonding the silicon sheet 18 and the metal foil 19 together.

The metal foil 19 is formed of a metal having an excellent electrical conductivity, such as silver, copper, aluminum, or the like. This allows excluding the effect of the metal foil 19 on the property evaluation as much as possible.

(Clip 21)

It is preferred that the clip 21 uses a crocodile clip or the like so as to be able to firmly fix the shield conductor holding sheets 20. Even when the shield conductor holding sheets 20 are fixed by the crocodile clip 21 having a strong clipping force, the shield conductor holding sheets 20 have the excellent elastic force and the excellent restoring force as described previously, and are therefore not damaged, but always allows the property evaluation in substantially the same conditions.

(Differential Signal Transmission Cable Property Evaluating Method)

Next, a differential signal transmission cable property evaluating method using the property evaluating mechanism 10 is described.

Figure 2:
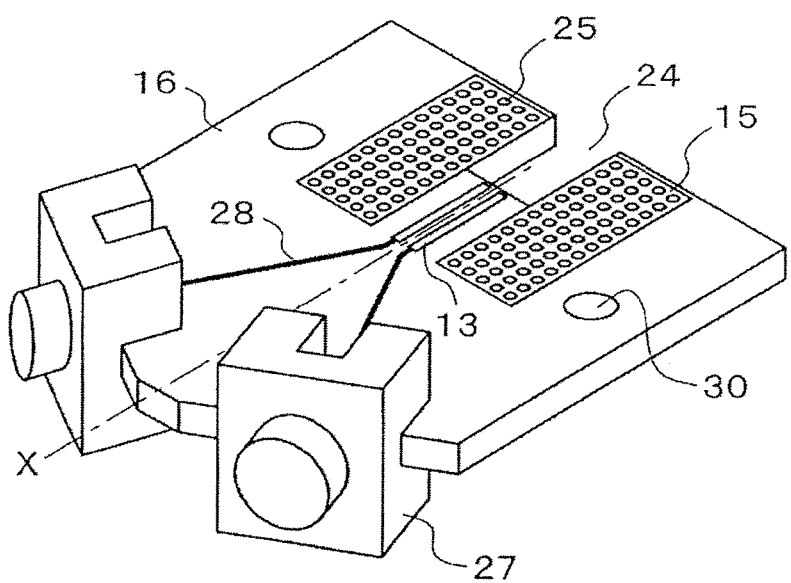
FIG. 2 is a perspective view showing a substrate for the differential signal transmission cable property evaluating mechanism of FIG. 1.

First, the differential signal transmission cable 11 to be evaluated is prepared. Herein, the differential signal transmission cable 11 to be used has the structure as shown in FIG. 7. Also, the substrate 16 as shown in FIG. 2 is prepared.

Figure 3:
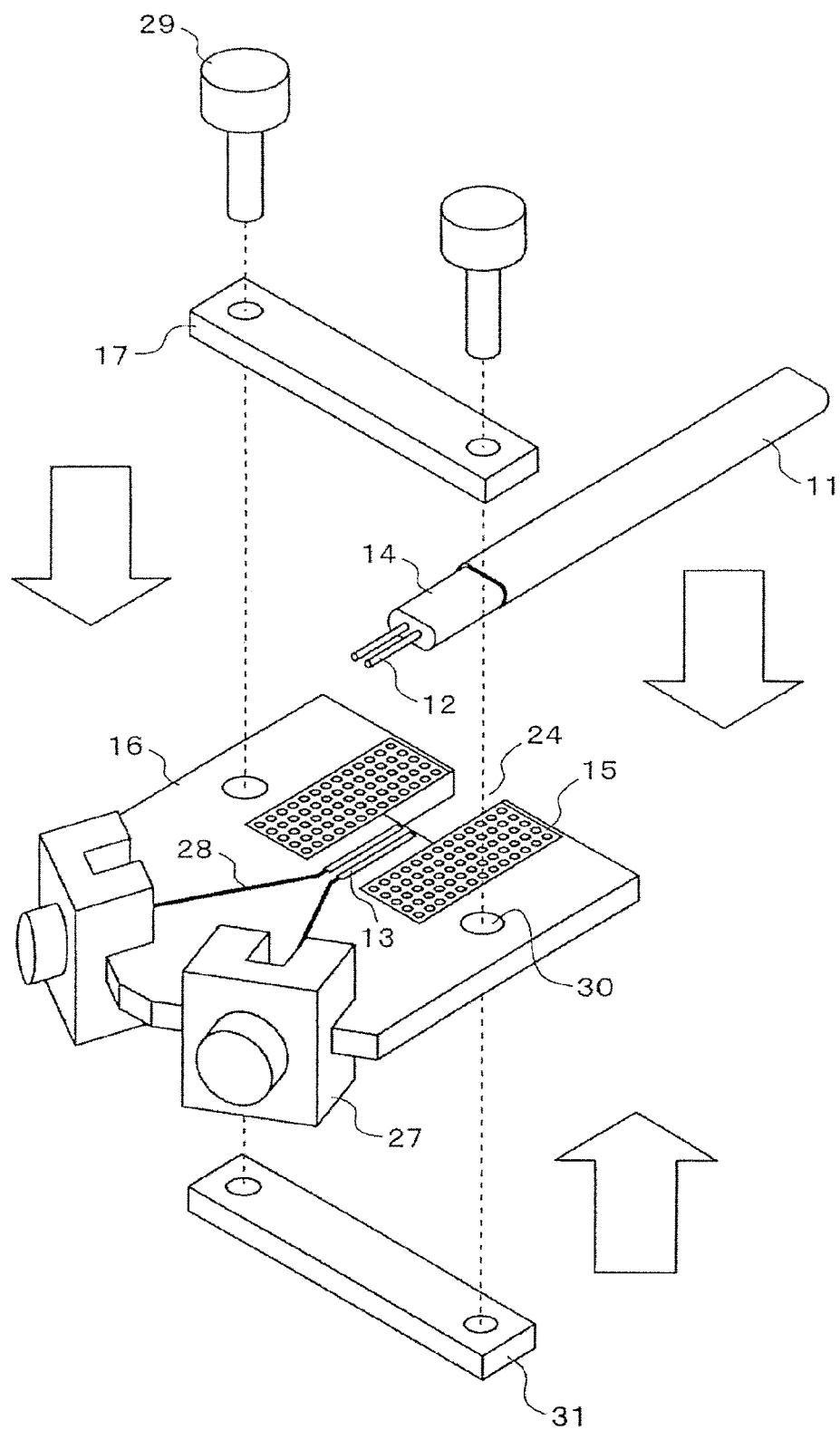
FIG. 3 is a perspective view showing a signal line conductor holding mechanism for the differential signal transmission cable property evaluating mechanism of FIG. 1.

Following that, as shown in FIG. 3, the terminal of the differential signal transmission cable 11 is placed in the notch 24 of the substrate 16, and the substrate 16 is sandwiched between the pressing member 17 and the fixing member 31, and the pressing member 17 and the fixing member 31 are fixed to the substrate 16 with the fastening members 29 to connect the signal line conductors 12 to the signal line pad 13.

The connection of the signal line conductors 12 to the signal line pad 13 is then visually confirmed an that the signal line conductors 12 are not bent, and are collinear with the signal line pad 13. This allows reducing the impedance mismatch at a differential mode.

Figure 4:
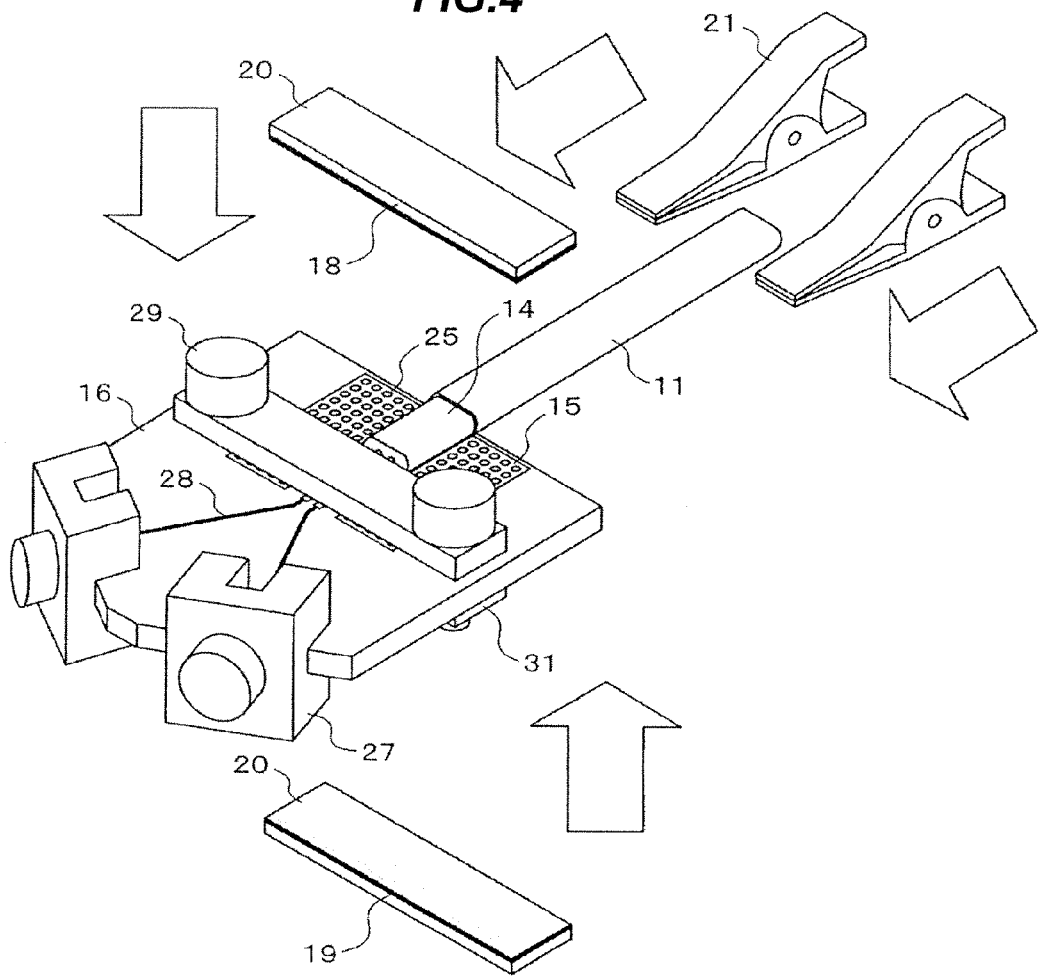
FIG. 4 is a perspective view showing a shield conductor holding mechanism for the differential signal transmission cable property evaluating mechanism of FIG. 1.

After the connection between the signal line conductors 12 and the signal line pad 13 being completed, as shown in FIG. 4, the shield conductor 14 is sandwiched between the shield conductor holding sheets 20 on both the surfaces, respectively, of the substrate 16, to connect the shield conductor 14 to the ground pads 15. To maintain the connection between the shield conductor 14 and the ground pads 15, the shield conductor holding sheets 20 are fixed with the clip 21.

The shield conductor holding sheets 20 are then disposed along the shape of the shield conductor 14 projecting from both the surfaces of the substrate 16. This allows mitigating the effect of the shield conductor holding sheets 20 on the electric field distribution around the shield conductor 14 and reducing the impedance mismatch at a common mode.

As described so far, the property evaluating mechanism 10 and the property evaluating method using the property evaluating mechanism 10 in this embodiment use no solder connection, but the pressing member 17 to connect the signal line conductors 12 and the signal line pad 13. This allows reducing the impedance mismatches (mainly, the impedance mismatch at the differential mode) caused at the terminal of the differential signal transmission cable 11 as much as possible, and thereby evaluating the pure property of the differential signal transmission cable 11 per se.

Also, in the property evaluating mechanism 10 and the property evaluating method using the property evaluating mechanism 10 in this embodiment, the substrate 16 is formed with the notch 24, so that the terminal of the differential signal transmission cable 11 is placed in the notch 24, to connect the shield conductor 14 and the ground pads 15 by the use of the shield conductor holding sheets 20. Therefore, in addition to the impedance mismatch at the differential mode for differential signal propagation, the impedance mismatch at the common mode for in-phase signal propagation can also be reduced. This allows reducing more degradation of signal quality due to reflection or noise.

Although in this embodiment the differential signal transmission cable 11 used has been described as having the structure shown in FIG. 7, the structure of the differential signal transmission cable 11 is not limited thereto.

Figure 8:
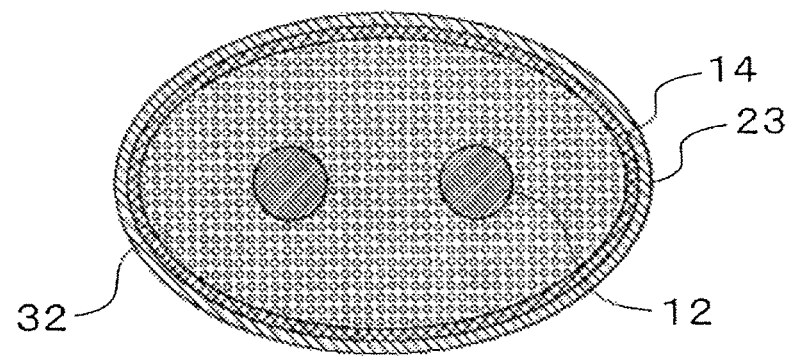
FIG. 8 is a cross sectional view showing a differential signal transmission cable used particularly in the invention.
Figure 9:
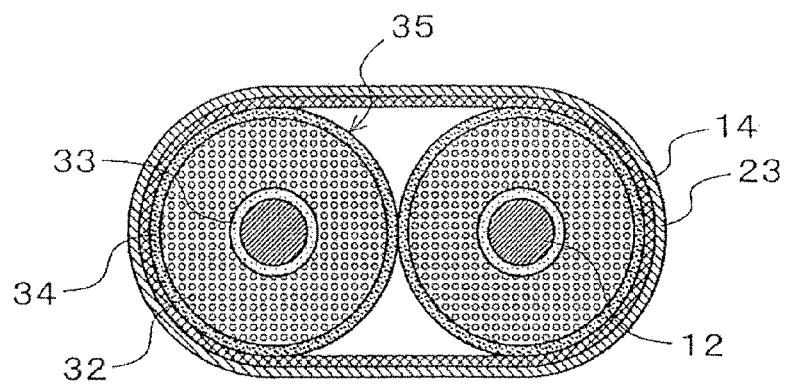
FIG. 9 is a cross sectional view showing a differential signal transmission cable used particularly in the invention.
Figure 10:
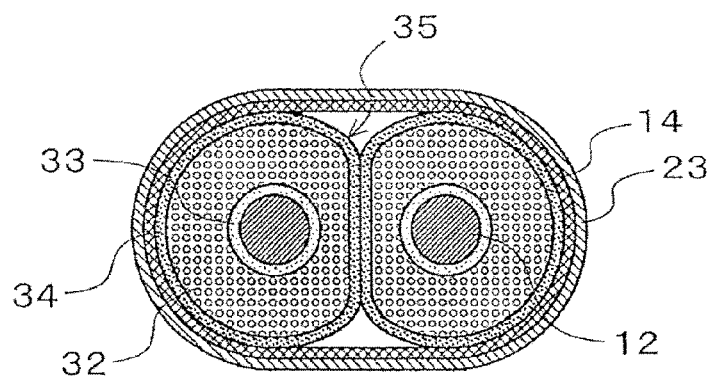
FIG. 10 is a cross sectional view showing a differential signal transmission cable used particularly in the invention.

For example, referring to FIGS. 8 to 10, as the differential signal transmission cable 11, there may be used one having a structure shown in FIG. 8 using a foam insulator 32 in place of the insulator 22, one having a structure shown in FIG. 9 with two electrical wires 35 longitudinally fitted together each formed by covering the signal line conductor 12 with an inner skin layer 33, the foam insulator 32, and an outer skin layer 34, and one having a structure shown in FIG. 10 with the two electrical wires 35 longitudinally fitted and fused together.

Figure 11:
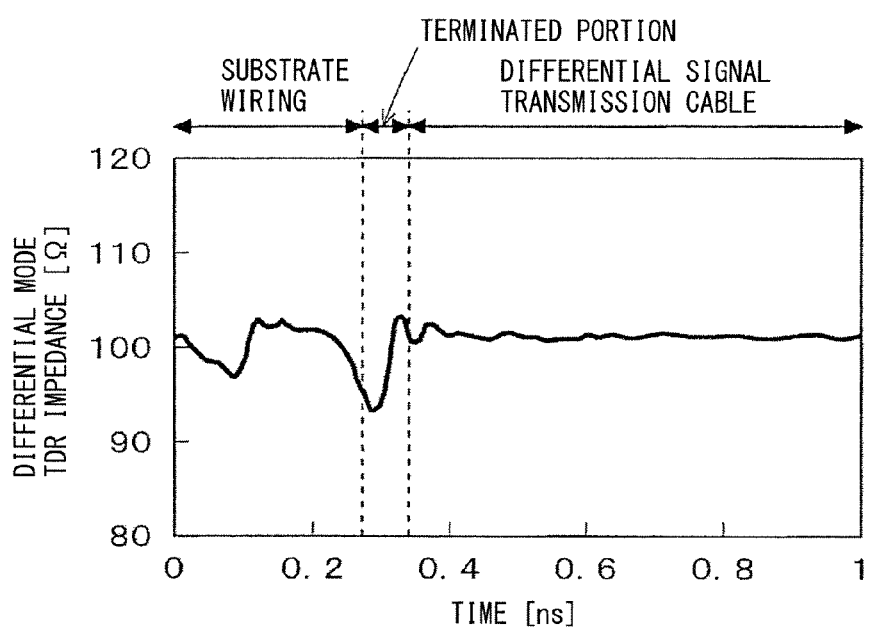
FIG. 11 is a diagram showing a TDR impedance at a differential mode in evaluating the differential signal transmission cable of FIG. 7 with the differential signal transmission cable property evaluating mechanism of FIG. 1.
Figure 12:
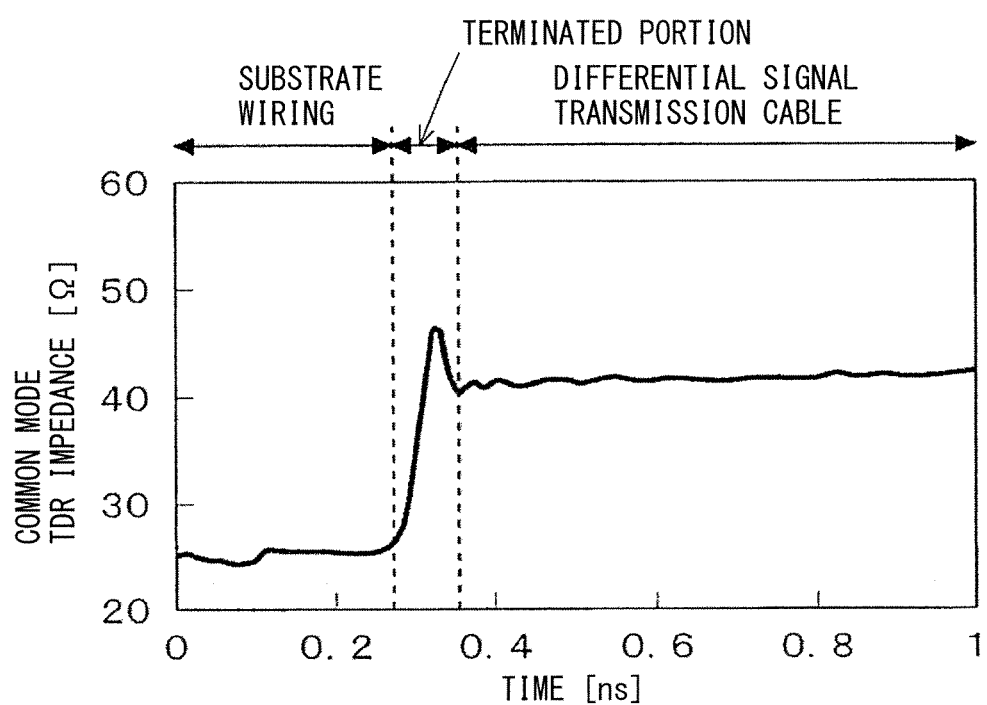
FIG. 12 is a diagram showing a TDR impedance at a common mode in evaluating the differential signal transmission cable of FIG. 7 with the differential signal transmission cable property evaluating mechanism of FIG. 1.

The property of the differential signal transmission cable 11 having the structure shown in FIG. 7 is evaluated by using the property evaluating mechanism 10 in this embodiment. Results thereof as shown in FIGS. 11 and 12 are obtained. FIG. 11 is a diagram showing a TDR (time domain reflectometry) impedance at the differential mode, and FIG. 12 is a diagram showing a TDR impedance at the common mode.

As shown in FIGS. 11 and 12, there is no significant impedance variation in the terminated portion, and the impedance of the substrate wiring and the impedance of the differential signal transmission cable 11 are smoothly connected together in the terminated portion. Accordingly, it is found that the impedance mismatch between the substrate wiring and the differential signal transmission cable 11 is reduced.

Also, from these results, it is found that, in the property evaluating mechanism 10, the common mode TDR impedance in the terminated portion of the differential signal transmission cable 11 is on the order of 46Ω, and the property evaluating mechanism 10 is therefore especially effective in the property evaluation for the differential signal transmission cable 11 having such a structure of the strengthened electromagnetic coupling between the signal line conductors 12 as the structures shown in FIGS. 7 to 10 respectively), and designed to have a common mode TDR impedance of 40Ω to 50Ω (e.g. on the order of 46Ω). That is, when the common mode TDR impedance value for the differential signal transmission cable 11, and the common mode TDR impedance value for the terminated portion of the differential signal transmission cable 11 in the property evaluating mechanism 10 are substantially equal, the impedance mismatch therebetween is small, and the effect thereof caused on the property evaluation is small.

As described above, the invention can provide the differential signal transmission cable property evaluating mechanism 10 and the property evaluating method therefor, which reduce the impedance mismatches resulting from the system impedance.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A differential signal transmission cable property evaluating mechanism, comprising:
   a substrate comprising:
      a signal line pad to be connected with a signal line conductor of a differential signal transmission cable; and
      a ground pad to be connected with a shield conductor of the differential signal transmission cable;
   a pressing member for pressing the signal line conductor into a direct contact with the signal line pad;
   a pair of shield conductor holding sheets, each comprising an elastic insulating sheet and a metal foil provided over one side of the elastic insulating sheet, the each shield conductor holding sheet provided for indirectly electrically connecting the shield conductor and the ground pad to each other by contacting the metal foil with the shield conductor and the ground pad;
   a clip for fixing the shield conductor holding sheet onto the substrate; and
   a notch provided at an edge of the substrate for accommodating a terminal of the differential signal transmission cable,
   wherein the ground pad comprises plural pads provided on both sides of the notch respectively on both surfaces of the substrate, and
   wherein the shield conductor is connected to each of the plural pads provided on the both surfaces of the substrate by one pair of the shield conductor holding sheets sandwiching the shield conductor therebetween on the both surfaces of the substrate.

2. The differential signal transmission cable property evaluating mechanism according to claim 1,
   wherein the signal line pad is provided at a position collinear with the signal line conductor when the terminal of the differential signal transmission cable is accommodated in the notch.

3. The differential signal transmission cable property evaluating mechanism according to claim 1, wherein the substrate comprises a material having a relative permittivity of 3.8 or less at a frequency of 1 MHz.

4. The differential signal transmission cable property evaluating mechanism according to claim 1, further comprising:
   a connection mechanism to connect the substrate to a measuring instrument.

5. The differential signal transmission cable property evaluating mechanism according to claim 1, further comprising:
   an electrically conductive paste provided on a surface of the ground pad.

6. The differential signal transmission cable property evaluating mechanism according to claim 1, wherein the pressing member comprises a transparent material having a relative permittivity not more than 3.2 at a frequency of 1 MHz.

7. The differential signal transmission cable property evaluating mechanism according to claim 1, wherein the pressing member comprises a material having a dielectric loss tangent not more than 0.01 at a frequency of 1 MHz.

8. The differential signal transmission cable property evaluating mechanism according to claim 1, wherein the elastic insulating sheet comprises a silicon sheet and the elastic insulating sheet and the metal foil are bonded together by a silicon based adhesive.

9. The differential signal transmission cable property evaluating mechanism according to claim 1, wherein the plural pads of the ground pad of the substrate surround a ground of a differential signal transmission cable.

10. The differential signal transmission cable property evaluating mechanism according to claim 1, wherein the signal line pad is provided at a position collinear with the signal line conductor, and
    wherein the elastic insulating sheet comprises a silicon sheet.

11. The differential signal transmission cable property evaluating mechanism according to claim 1, wherein the elastic insulating sheet and the metal foil are bonded together by a silicon based adhesive.

12. A differential signal transmission cable property evaluating method, comprising:
    evaluating a property of a differential signal transmission cable including preparing of the differential signal transmission cable for using the differential signal transmission cable property evaluating mechanism according to claim 1.

13. The differential signal transmission cable property evaluating method according to claim 12, comprising:
    evaluating the property of the differential signal transmission cable having a common mode time domain reflectometry impedance of 40Ω to 50Ω.

14. A differential signal transmission cable property evaluating method, comprising:
    evaluating a property of a differential signal transmission cable including preparing of the differential signal transmission cable for using the differential signal transmission cable property evaluating mechanism according to claim 2.

15. A differential signal transmission cable property evaluating method, comprising:
    evaluating a property of a differential signal transmission cable including preparing of the differential signal transmission cable for using the differential signal transmission cable property evaluating mechanism according to claim 3.

16. A differential signal transmission cable property evaluating method, comprising:
    evaluating a property of a differential signal transmission cable including preparing of the differential signal transmission cable for using the differential signal transmission cable property evaluating mechanism according to claim 4.

17. A differential signal transmission cable property evaluating method, comprising:
    evaluating a property of a differential signal transmission cable including preparing of the differential signal transmission cable for using the differential signal transmission cable property evaluating mechanism according to claim 5.

18. A differential signal transmission cable property evaluating method, comprising:
    evaluating a property of a differential signal transmission cable including preparing of the differential signal transmission cable for using the differential signal transmission cable property evaluating mechanism according to claim 6.

19. A differential signal transmission cable property evaluating method, comprising:

evaluating a property of a differential signal transmission cable including preparing of the differential signal transmission cable for using the differential signal transmission cable property evaluating mechanism according to claim 7.

20. A differential signal transmission cable property evaluating method, comprising:
evaluating a property of a differential signal transmission cable including preparing of the differential signal transmission cable for using the differential signal transmission cable property evaluating mechanism according to claim 8.

* * * * *